United States Patent
Lehman et al.

(10) Patent No.: US 7,673,389 B2
(45) Date of Patent: Mar. 9, 2010

(54) COLD PLATE APPARATUS AND METHOD OF FABRICATION THEREOF WITH A CONTROLLED HEAT TRANSFER CHARACTERISTIC BETWEEN A METALLURGICALLY BONDED TUBE AND HEAT SINK FOR FACILITATING COOLING OF AN ELECTRONICS COMPONENT

(75) Inventors: Bret W. Lehman, Raleigh, NC (US); Roger R. Schmidt, Poughkeepsie, NY (US); Prabjit Singh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1267 days.

(21) Appl. No.: 11/184,654

(22) Filed: Jul. 19, 2005

(65) Prior Publication Data

US 2007/0017658 A1     Jan. 25, 2007

(51) Int. Cl.
*B21D 53/02* (2006.01)
*B22D 19/00* (2006.01)
*B22D 19/14* (2006.01)
*B23P 15/26* (2006.01)
*F28F 3/12* (2006.01)
*H05K 7/20* (2006.01)

(52) U.S. Cl. .............. 29/890.038; 29/890.043; 29/890.04; 29/890.041; 164/93; 164/98; 164/99; 165/168; 361/702

(58) Field of Classification Search .............. 29/890.03, 29/890.038, 890.04, 890.041, 890.043; 164/93, 164/98, 99; 165/168; 361/702
See application file for complete search history.

(56) References Cited

U.S. PATENT DOCUMENTS 3,848,666 A * 11/1974 Valdo .............. 165/168
3,853,309 A * 12/1974 Widmer ............ 266/270

(Continued)

FOREIGN PATENT DOCUMENTS

CN     1535780 A     10/2004

OTHER PUBLICATIONS

Reed-Hill, Robert E., "Physical Metallurgy Principles,", D. Van Nostrand Company, Inc., pp. 308-366 (1964).

*Primary Examiner*—David P Bryant
*Assistant Examiner*—Alexander P Taousakis
(74) *Attorney, Agent, or Firm*—Geraldine Monteleone, Esq.; Kevin P. Radigan, Esq.; Heslin Rothenberg Farley & Mesiti P.C.

(57) ABSTRACT

Cold plate apparatuses and methods of fabrication are provided for facilitating cooling of an electronics component. The fabrication approach includes: forming a tube with a first metal and having first and second ends with a heat transfer region disposed therebetween; positioning the heat transfer region of the tube within a mold and casting a heat sink member around the tube by contacting a second metal in molten form over the tube, wherein the first and second metals react peritectically to form an alloy layer between the tube and the heat sink member, and a metallurgical bond is formed between the tube and heat sink member with cooling of the molten second metal; and controlling casting of the heat sink member to minimize a thickness of the alloy layer to enhance a heat transfer characteristic of the metallurgical bond formed between the tube and the heat sink member.

8 Claims, 5 Drawing Sheets

U.S. PATENT DOCUMENTS

| | | | |
|---|---|---|---|
| 4,075,376 A | 2/1978 | Jaeger | 428/26 |
| 4,730,666 A * | 3/1988 | Flint et al. | 165/80.4 |
| 4,847,044 A | 7/1989 | Ghosh | 419/8 |
| 5,256,214 A | 10/1993 | Ashok | 148/411 |
| 5,473,207 A | 12/1995 | Hopeck et al. | 310/65 |
| 5,806,588 A | 9/1998 | Weeks, Jr. et al. | 165/181 |
| 5,819,839 A | 10/1998 | Mihelich et al. | 164/312 |
| 6,144,006 A | 11/2000 | White et al. | 219/91.2 |
| 6,257,310 B1 * | 7/2001 | Janko | 164/61 |
| 6,668,912 B2 | 12/2003 | Adams et al. | 165/80.4 |
| 6,736,188 B2 | 5/2004 | Vining et al. | 164/312 |
| 2005/0133187 A1 * | 6/2005 | Seaver et al. | 164/98 |

\* cited by examiner

COLD PLATE APPARATUS AND METHOD OF FABRICATION THEREOF WITH A CONTROLLED HEAT TRANSFER CHARACTERISTIC BETWEEN A METALLURGICALLY BONDED TUBE AND HEAT SINK FOR FACILITATING COOLING OF AN ELECTRONICS COMPONENT

TECHNICAL FIELD

The present invention relates generally to heat transfer mechanisms, and more particularly, to cooling apparatuses and methods of fabrication thereof for removing heat generated by one or more electronic devices, modules and systems. Still more particularly, the present invention relates to cold plate apparatuses and methods of fabrication thereof with a controlled heat transfer characteristic across a metallurgical bonded tube and casted heat sink formed by peritectic reaction of the tube and heat sink.

BACKGROUND OF THE INVENTION

As is known, operating electronic devices produce heat. This heat should be removed from the devices in order to maintain device junction temperatures within desirable limits. Failure to remove the heat thus produced results in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/$cm^2$) increases, resulting in the need to remove more power from a given size chip or module. Additionally, a common packaging configuration for many large computer systems today is a multi-drawer rack, with each drawer containing one or more processor modules along with associated electronics, such as memory, power and hard drive devices. These drawers are removable units so that in the event of failure of an individual drawer, the drawer may be removed and replaced in the field. A problem with this configuration is the increase in heat flux at the electronics drawer level. The above-noted trends have combined to create applications where it is no longer desirable to remove heat from modern devices solely by traditional air cooling methods, such as by using traditional air cooled heat sinks. These trends are likely to continue, furthering the need for alternatives to traditional air cooling methods.

One approach to avoiding the limitations of traditional air cooling is to use a cooling liquid. As is known, different liquids provide different cooling capabilities. In particular, liquids such as refrigerants or other dielectric fluids (e.g., fluorocarbon fluid) exhibit relatively poor thermal conductivity and specific heat properties, i.e., when compared to liquids such as water or other aqueous fluids. Dielectric liquids have an advantage, however, in that they may be placed in direct physical contact with electronic devices and interconnects without adverse affects such as corrosion or electrical short circuits.

Other cooling liquids, such as water or other aqueous fluids, exhibit superior thermal conductivity and specific heat compared to dielectric liquids. Water-based coolants, however, must be kept from physical contact with electronic devices and interconnect, since corrosion and electrical short circuit problems are likely to result from contact. Various methods have been disclosed for using water-based coolants, while providing physical separation between the coolant the electronic devices. For example, a cold plate apparatus can be employed wherein coolant passes through channels within the cold plate, wherein the plate is physically coupled to the one or more electronic devices, thereby facilitating the extraction of heat therefrom.

Notwithstanding the above, there remains a large and significant need to provide further enhanced cooling apparatuses and methods of fabrication thereof for facilitating cooling of electronic circuit devices such as electronic modules disposed, e.g., in a multi-drawer electronics rack.

SUMMARY OF THE INVENTION

One such cooling apparatus would be an aluminum cold plate with embedded copper tubes. Copper tubes can be embedded in aluminum cold plates by various mechanical means. For example, fabricated copper tubes could be mechanically coupled or soldered in place within one or more aluminum cold plate parts, which are then assembled around the copper tubing. A less expensive means for manufacturing such an assembly, however, is desirable. One cost-effective technique would be to cast an aluminum heat sink member directly around one or more copper tubes, which define the channels through which coolant is to pass. The use of copper advantageously limits corrosion resulting from the use of water or other aqueous fluids as coolant, while aluminum for the cold plate is a good thermal conductor, low cost and lightweight. This approach, however, is not practical since molten aluminum reacts eutectically with copper to dissolve copper tubing at a very rapid rate.

These shortcomings of the prior art are overcome and additional advantages are provided through a method of fabricating a cold plate apparatus. The method includes: providing a tube comprising a first metal, the tube having a first end and a second end with a heat transfer region disposed therebetween; positioning the heat transfer region of the tube within a mold and casting a heat sink member around the heat transfer region of the tube by contacting a second metal in molten form over the heat transfer region of the tube, wherein the second metal has a lower melting point than the first metal, the first metal of the tube and the molten second metal react peritectically during casting of the heat sink member to form an alloy layer between the tube and the heat sink member in the heat transfer region of the tube, and a metallurgical bond is formed between the tube and the heat sink member in the heat transfer region of the tube with cooling of the molten second metal, and wherein the first end and the second end of the tube extend from the heat sink member; and controlling the casting of the heat sink member to minimize a thickness of the alloy layer formed between the tube and the heat sink member in the heat transfer region of the tube, wherein the minimizing the thickness of the alloy layer enhances a heat transfer characteristic of the metallurgical bond formed between the tube and the heat sink member.

In another aspect, a cold plate apparatus for facilitating cooling of a heat generating electronics component is provided. The cold plate apparatus includes a tube and a casted heat sink member. The tube comprises a first metal and has a first end and a second end with a heat transfer region disposed therebetween. The casted heat sink member comprises a second metal and surrounds the heat transfer region of the tube, with the first end and the second end of the tube extending from the casted heat sink member. A metallurgical bond exists between the tube and the heat sink member in the heat transfer region of the tube. The cold plate apparatus further includes an alloy layer between the tube and the casted heat sink member in the heat transfer region of the tube. The alloy layer was formed during casting of the heat sink member by the first metal of the tube and the second metal of the heat sink member reacting peritectically, and the thickness of the alloy layer was minimized during casting of the heat sink member to enhance a heat transfer characteristic of the metallurgical bond between the tube and the heat sink member in the heat transfer region of the tube.

Still further, a fluid-cooled electronics apparatus is provided. This apparatus includes a heat generating electronics component, and a cold plate apparatus with a surface thereof coupled to a surface of the heat generating electronics component for facilitating removal of heat from the heat generating electronics component. The cold plate apparatus includes a tube and a casted heat sink member. The tube comprises a first metal, and has a first end and a second end with a heat transfer region disposed therebetween. The casted heat sink member comprises a second metal, and the member surrounds the heat transfer region of the tube. The first end and the second end of the tube extend from the casted heat sink member. A metallurgical bond exists between the tube and the heat sink member in the heat transfer region of the tube. The cold plate apparatus further includes an alloy layer disposed between the tube and the casted heat sink member in the heat transfer region of the tube, wherein the alloy layer was formed during casting of the heat sink member by the first metal of the tube and the second metal of the heat sink reacting peritectically. The thickness of the alloy layer was minimized during casting of the heat sink member to enhance a heat transfer characteristic of the metallurgical bond between the tube and the heat sink member in the heat transfer region of the tube.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein, "electronics subsystem" comprises any housing, compartment, drawer, blade, etc., containing one or more heat generating components of a computer system or other electronics system requiring cooling. The term "electronics rack" includes any frame, rack, blade server system, etc., having a heat generating component of a computer system or electronics system, and may be, for example, a stand alone computer processor having high, mid or low end processing capability. In one embodiment, an electronics rack may comprise multiple electronics subsystems, each having one or more heat generating electronics components requiring cooling. Each "heat generating electronics component" may comprise an electronic device, an electronics module, an integrated circuit chip, etc.

One example of coolant within a cooling system in accordance with an aspect of the present invention is water. However, the concepts disclosed herein are readily adapted to use with other types of coolant on the facility side and the system side of a cooling system. For example, one or more of the coolants may comprise a brine, a fluorocarbon liquid, a liquid metal, or other similar coolant, or a refrigerant, while still maintaining the advantages and unique features of the present invention.

As noted briefly above, power levels in computer equipment (primarily processors) are again rising to a level where they no longer can be simply air cooled. The components will likely be water cooled. Heat dissipated by a processor can be transferred to water via a water cooled cold plate apparatus. Facility water typically available at customer locations (i.e., data centers) is not suitable for use in these cold plates. First, condensation formation is a concern as the temperature of the data center water, ranging from 7° C. to 15° C., is far below the room dew point (typically 18-23° C.). Second, the relatively poor quality of the facility water (in chemistry, cleanliness, etc.) impacts system reliability. It is therefore desirable to utilize a water cooling/conditioning unit that circulates higher quality water to/from the electronics subsystems and rejects the heat to the data center water. As used herein, "facility water" or "facility coolant" refers to, in one example, this data center water or coolant, while "system coolant"

refers to cooled/conditioned coolant circulating between a coolant distribution unit and the electronics subsystems to be cooled.

Figure 1:
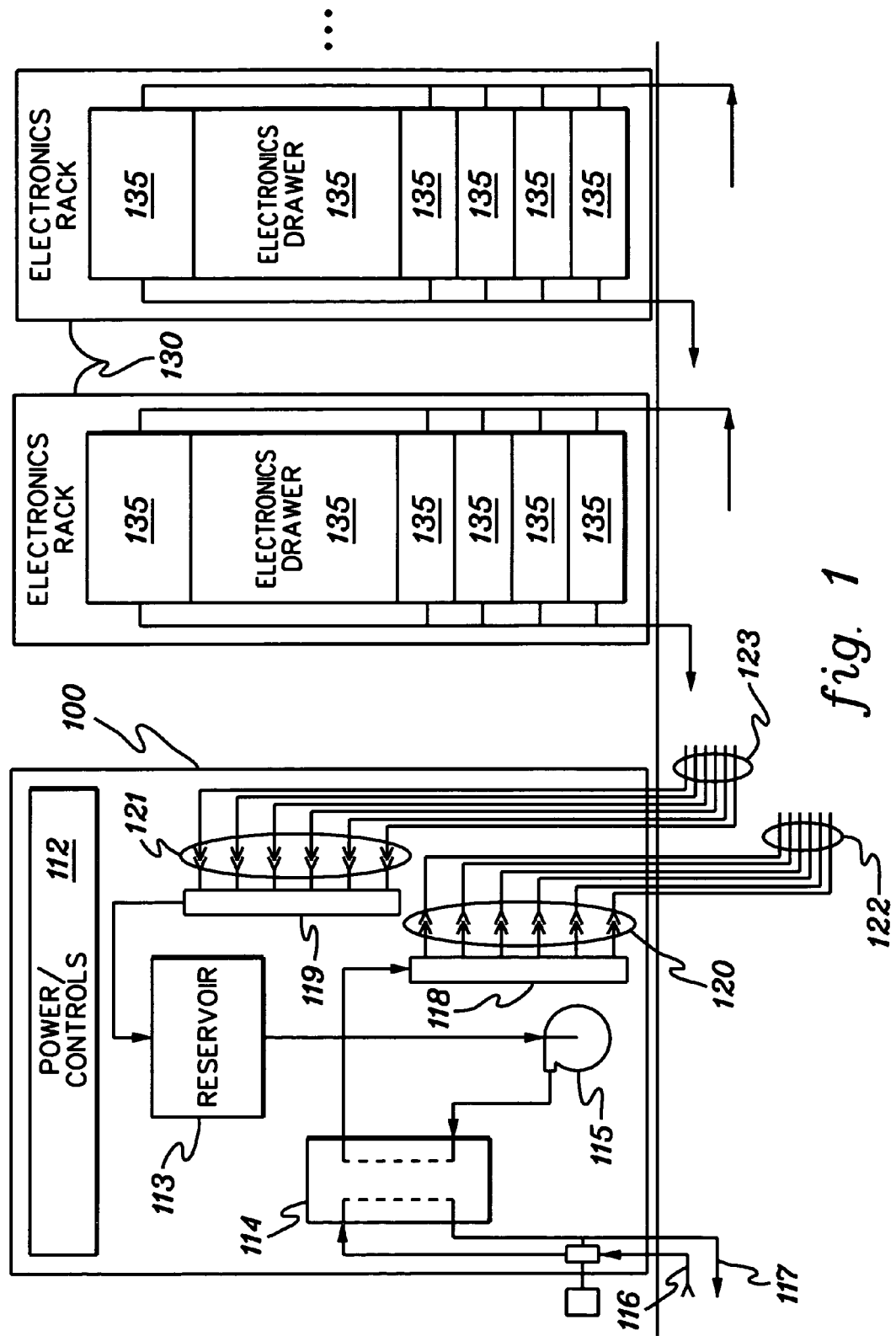
FIG. 1 depicts a conventional coolant distribution unit, such as a computer room water conditioning unit (CRWCU), for cooling electronics racks of a computing environment, one or more of which are to employ cooling apparatuses, in accordance with an aspect of the present invention.

Reference is now made to the drawings, wherein the same reference numbers used throughout different figures designate the same or similar components. FIG. 1 depicts one embodiment of a coolant distribution unit 100 for a computer room. The coolant distribution unit is conventionally a relatively large unit which occupies more than what would now be considered as two full electronics frames. Within the cooling unit 100 is a power/control element 112, a reservoir/expansion tank 113, a heat exchanger 114, a pump 115 (often accompanied by a redundant second pump), facility water (or site or customer service water or coolant) inlet 116 and outlet 117 supply pipes, a supply manifold 118 directing water to the electronics frames 130 via couplings 120 and lines 122, and a return manifold 119 directing water from the electronics frames 130, via lines 123 and couplings 121. Each electronics rack includes multiple electronics drawers or multiple electronics subsystems 135.

Figure 2:
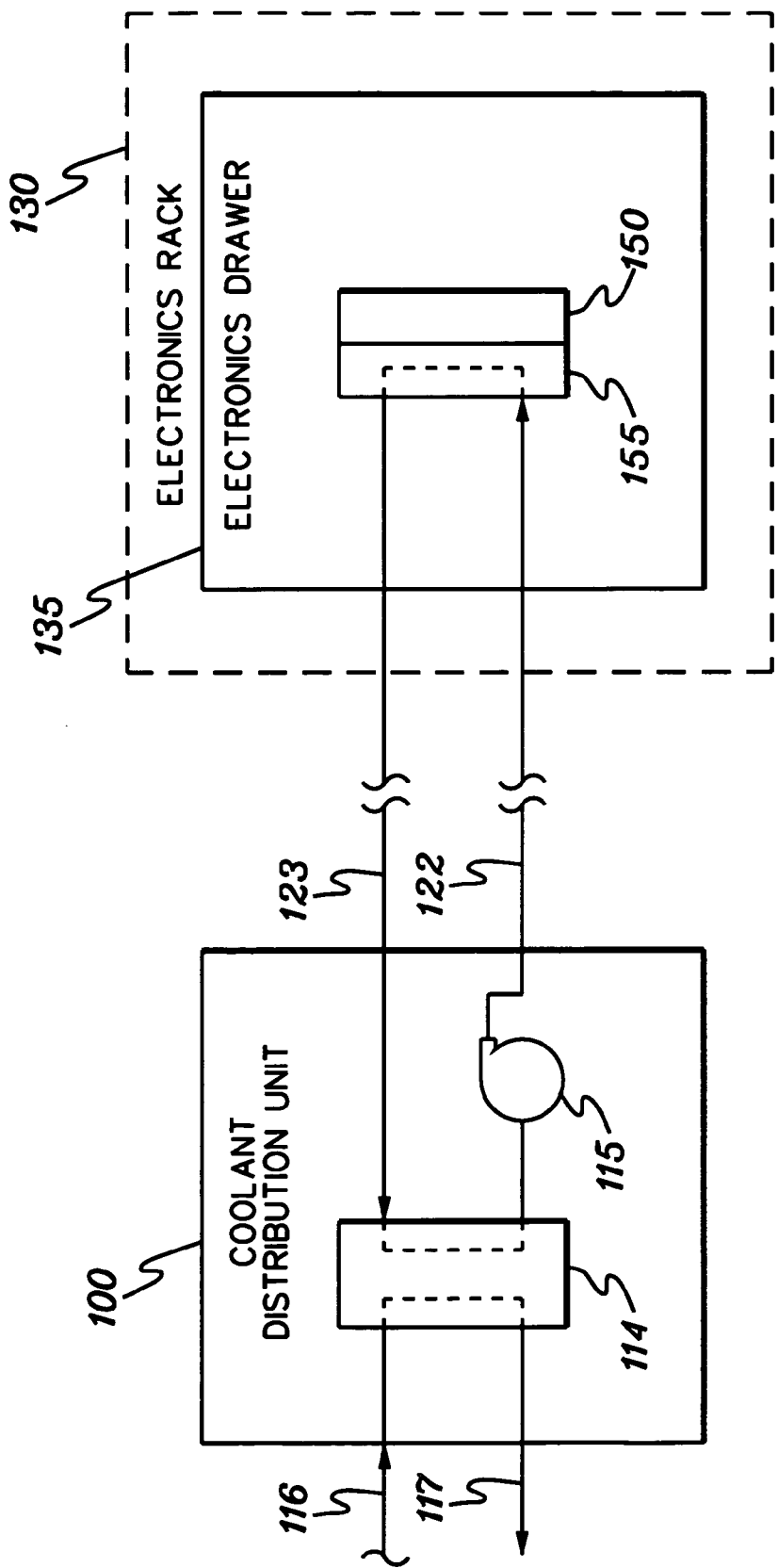
FIG. 2 is a schematic of one embodiment of an electronics drawer of an electronics rack and a cooling system therefor employing a cooling distribution unit with a facility coolant loop and a system coolant loop, and employing a cooling apparatus contacting an electronic device, in accordance with the present invention.

FIG. 2 schematically illustrates operation of the cooling system of FIG. 1, wherein a liquid cooled cold plate apparatus 155 is shown coupled to an electronic device 150 of electronics drawer 135 within electronics rack 130. Heat is removed from electronic device 150 via the system coolant pumped via pump 115 through cold plate apparatus 155 within the system coolant loop defined by heat exchanger 114 of coolant distribution unit 100, lines 122, 123 and cold plate 155. The system coolant loop and coolant distribution unit are designed to provide coolant of a controlled temperature and pressure, as well as controlled chemistry and cleanliness to the electronics. Furthermore, the system coolant is physically separate from the less controlled facility coolant in lines 116, 117 to which heat is ultimately transferred to. Filtration has not been required in a system such as depicted in FIG. 2 since the system coolant loop has characteristic dimensions for fluid flow that are sufficiently large to allow residual particulate debris to flow freely through the loop. For example, a cold plate apparatus with 1.65 mm diameter channels was employed in the ES/9000 system offered by International Business Machines Corporation of Armonk, N.Y.

As noted above, water or aqueous based cooling liquids exhibit superior thermal conductivity and specific heat compared to dielectric liquids. Thus, it is advantageous to employ water or other aqueous based coolant within the liquid cooled cold plate 155 to facilitate transfer of heat from the electronic device 150. One such cooling apparatus would be an aluminum heat sink member with embedded copper tubes. Copper tubing is resistant to corrosion by water, while aluminum is a good thermal conductor, and is lightweight. However, a cost effective way of fabricating a complicated shaped aluminum cold plate with water channels is desired. One technique would be to cast an aluminum heat sink around appropriately shaped metal tubes. The casting mold shapes the outer surfaces of the aluminum heat sink to the desired shape, while the inside of the embedded tubes provides the water channels to cool the cold plate. Unfortunately, molten aluminum is very reactive and will dissolve copper at a fast rate when in contact. Thus, presented herein are various techniques for casting a metal such as aluminum around a metal tube without the metal tube dissolving within the molten aluminum, and with the resultant structure having a controlled heat transfer characteristic across the metallurgically bonded tube and heat sink member.

In the following discussion, and the appended claims, a "phase" refers to a macroscopically homogeneous body of matter; a "eutectic reaction" is a reaction wherein a liquid transforms into two solid phases as the molten metal is cooled; and a "peritectic reaction" refers to a liquid and a solid reacting to produce a new and different solid alloy phase.

Figure 3A:
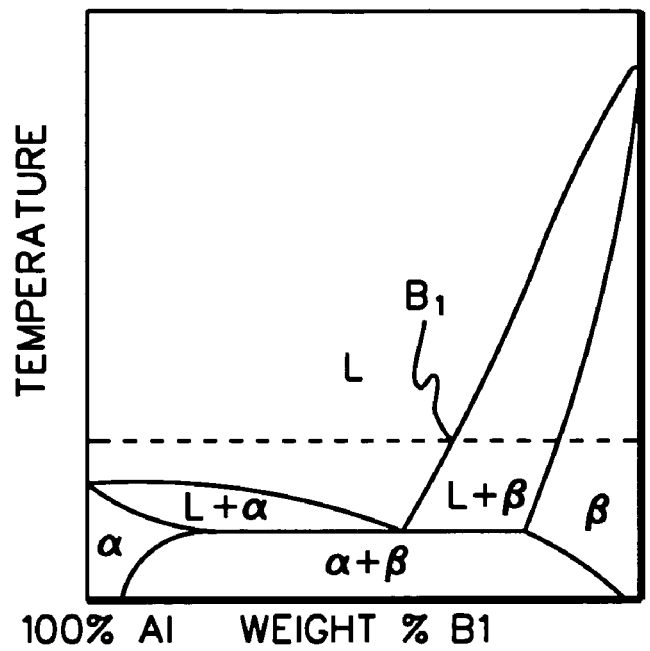
FIG. 3A is a sample eutectic reaction phase diagram for aluminum and a metal B1.
Figure 3B:
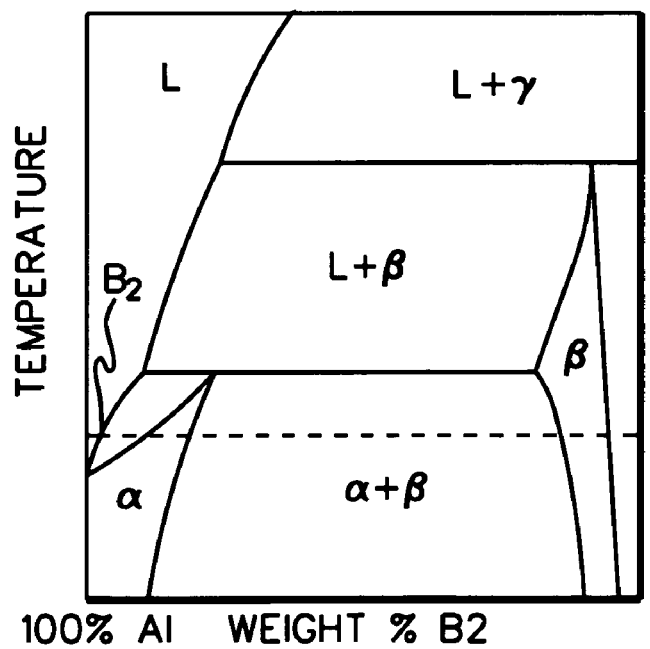
FIG. 3B is a sample peritectic reaction phase diagram for aluminum and a metal B2, in accordance with an aspect of the present invention.

FIG. 3A is an example of a eutectic phase diagram for aluminum (Al) with a higher melting point element B1, while FIG. 3B is an example of a peritectic phase diagram of aluminum with a different higher melting point element B2. In the phase diagrams:

L=a liquid or molten phase;
$B_1$=a first sample point on the eutectic phase diagram;
$B_2$=a second sample point on the peritectic phase diagram;
α=an aluminum rich solid phase;
β=a solid phase rich in component B1 (for FIG. 3A) or component B2 (for FIG. 3B); and
γ=a different solid phase formed between two components or elements, that is, a two-component alloy formed, for example, by aluminum and metal B2.

In the sample eutectic phase diagram, if molten aluminum, heated to a temperature indicated by the dashed line, is poured onto a piece of solid element B1, with which it reacts eutectically, the composition of the liquid aluminum will range anywhere from pure aluminum far from solid metal B1 to a composition $B_1$ near solid metal B1 (not shown). Thus, the liquid composition varies widely as shown. The slope of the composition versus distance is the composition gradient, which drives the diffusion of metal B1 in molten aluminum. The higher the diffusion of metal B1 in aluminum, the faster will be the dissolution of solid B1 in aluminum. Thus, elements with which aluminum reacts eutectically dissolve quickly in molten aluminum.

For the sample peritectic phase diagram, which illustrates a peritectic reaction of molten aluminum with solid metal B2, the molten aluminum composition is shown to vary only slightly from pure aluminum to a solid composition at sample point B2. This small composition gradient in the liquid aluminum, leads to a very slow diffusion of metal B2 into molten aluminum, i.e., metal B2 dissolves slowly in molten aluminum. Thus, elements with which aluminum reacts peritectically dissolve slowly in liquid aluminum. This difference between the eutectic reaction of molten aluminum with metal B1, and the peritectic reaction of molten aluminum with metal B2 is advantageously employed by aspects of the present invention.

Binary phase diagrams between aluminum and various other metals are available in the art. For example reference *Metals Handbook*, Vol. 8, Eighth Edition, American Society for Metals, 1973, pages 256-265. By way of example, cobalt, copper, iron, lithium, magnesium and nickel react eutectically with molten aluminum and readily dissolve in the molten aluminum, while niobium, chromium, hafnium, tantalum, zirconium, titanium and tungsten react peritectically with molten aluminum and do not readily dissolve in the molten aluminum. Thus, in accordance with an aspect of the present invention, a cold plate apparatus is constructed by casting molten aluminum around a preformed tube comprising a metal which reacts peritectically with the molten aluminum, that is, a metal that has a peritectic phase diagram with aluminum.

Figure 4:
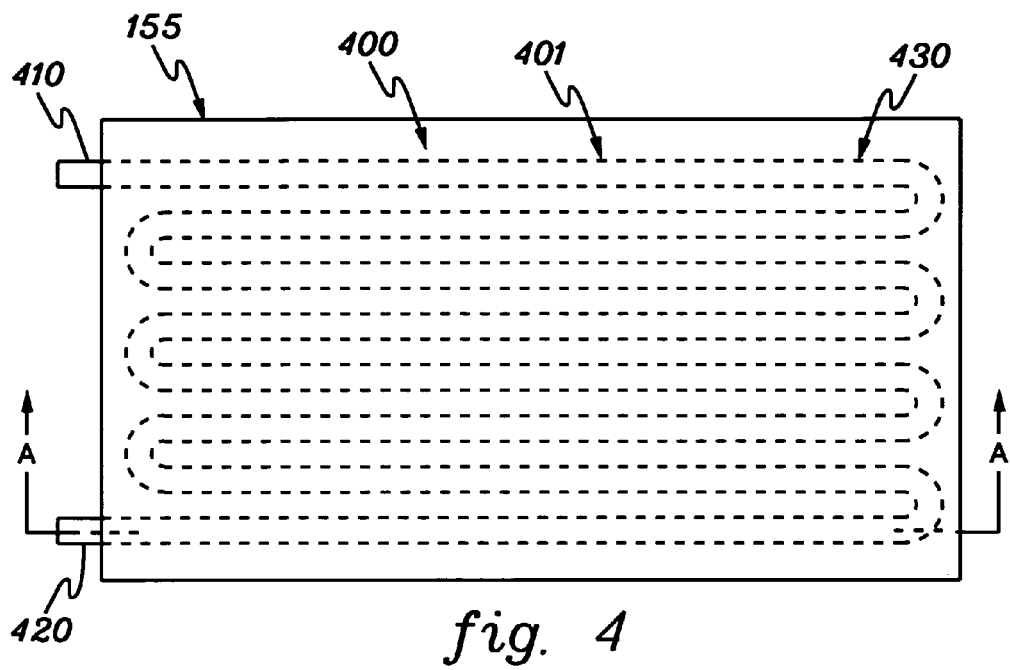
FIG. 4 depicts a plan view of one embodiment of a cold plate apparatus, in accordance with an aspect of the present invention.

FIG. 4 depicts a plan view of one embodiment of a cold plate apparatus 155 which includes a tube 430 and a heat sink member 400. As shown, tube 430 has a heat transfer region 401 (with a sinusoidal shape) embedded within the heat sink member 400. Tube 430 also includes an inlet end 410 and outlet end 420 for allowing water or other coolant to pass through the cold plate apparatus.

Figure 4A:
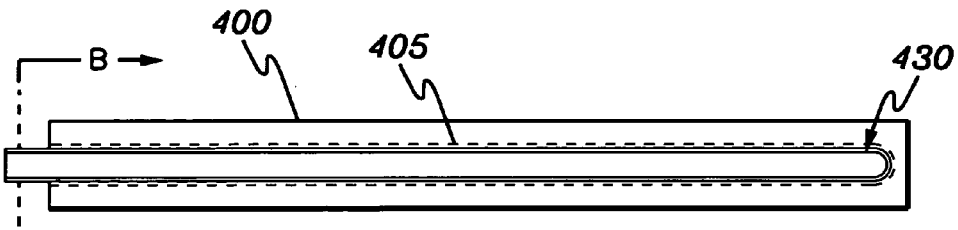
FIG. 4A is a cross-sectional elevational view of the cold plate apparatus of FIG. 4 taken along line A-A, in accordance with an aspect of the present invention.

FIG. 4A is a cross-sectional elevational view of the cold plate apparatus of FIG. 4 taken along line A-A. This figure further illustrates the heat transfer region of tube 430 embedded within heat sink member 400. In one aspect, tube 430 comprises a metal formed of an element that reacts peritectically with molten aluminum, and thus, will not dissolve readily in the molten aluminum during a casting operation. By its nature, the peritectic reaction occurs above the melting point of aluminum, and molten aluminum will dissolve peritectic forming metals at a slower rate than a eutectic forming metal. Again, examples of metals that have peritectic reaction with molten aluminum are niobium (Nb), hafnium (Hf), tantalum (Ta), zirconium (Zr), titanium (Ti) and tungsten (W).

Also shown in FIG. 4A is an alloy layer 405 which results from the peritectic reaction between tube 430 and heat sink member 400 during casting of the heat sink member. Further, a metallurgical bond exists between the tube and heat sink member in the heat transfer region of the tube embedded within the heat sink. In accordance with an aspect of the present invention, casting of the heat sink member is controlled to minimize a thickness of alloy layer 405, for example, to less than 10 μm. By minimizing thickness of the alloy layer, a heat transfer characteristic of the metallurgical bond between the tube and heat sink member is enhanced, i.e., because thermal conductance of the alloy layer is lower than the thermal conductance of the pure metal tube.

Figure 4B:
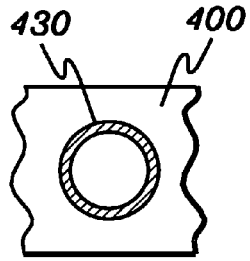
FIG. 4B is a cross-sectional elevational view of the cold plate apparatus of FIG. 4A taken along line B-B, showing a cross-section of one embodiment of the tube metallurgically bonded to the heat sink member, in accordance with an aspect of the present invention.

FIG. 4B is a cross-sectional elevational view of the cold plate apparatus of FIGS. 4 & 4A taken along line B-B of FIG. 4A. In this embodiment, tube 430 comprises, for example, a substantially pure tube of niobium, hafnium, tantalum, zirconium, titanium or tungsten, which has a good heat transfer characteristic and is resistant to corrosion from a water based coolant flowing through the tube.

Figure 4C:
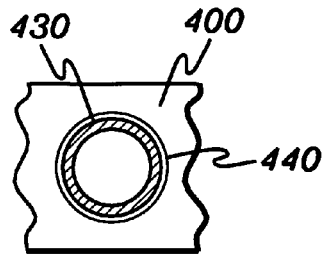
FIG. 4C is a cross-sectional elevational view of the cold plate apparatus of FIG. 4A taken along line B-B, showing a cross-section of an alternate embodiment of the tube metallurgically bonded to the heat sink member, in accordance with an aspect of the present invention.

FIG. 4C depicts an alternative embodiment of a cold plate apparatus in accordance with an aspect of the present invention, again taken along line B-B of FIG. 4A. In this embodiment, the tube comprises, for example, a copper tube structure 430 which is coated with a metal coating 440 of niobium, hafnium, tantalum, zirconium, titanium or tungsten prior to the casting of the heat sink member 400. By pre-coating the copper tubing with a metal which reacts peritectically with molten aluminum, it is possible to cast the aluminum heat sink member around the preconfigured copper tube. This metal coating, which can be formed by sputtering, physical vapor deposition, ion vapor deposition, electroplating, electroless plating, etc., can be in a range of 0.025 to 0.25 mm (i.e., 1 to 10 mils) thick. Advantageously, during casting of the heat sink member, the molten aluminum does not dissolve away the embedded tube because the protective metal coating reacts slowly, that is peritectically, with the molten aluminum, thereby protecting the underlying copper tube from dissolution by the molten aluminum.

By way of further example, a tube structure, such as a copper tube, could be coated over an outer surface thereof in at least a designated heat transfer region (e.g., a sinusoidal shaped region to be embedded in the heat sink member) by a metal that reacts peritectically with molten aluminum. During casting of a heat sink member, the molten aluminum is controlled to be in the range of 660-750° C. The coating metals of interest again are niobium, chromium, hafnium, tantalum, zirconium, titanium and tungsten. One metal that may be advantageously employed is chromium. This metal reacts peritectically with aluminum, and can be readily electroplated onto a copper tube structure. An alternative metal is titanium, which can be vapor deposited onto a copper tube structure. The thickness of the coating over the tube structure is preferably selected so as to attain the result of protecting the underlying copper tubing, while also minimizing the coating thickness in order to limit costs of the pre-coated tubing and enhance the heat transfer characteristics of the resultant structure. By way of example, a coating thickness in the range of 0.02 to 0.2 mm may be employed.

Figure 5:
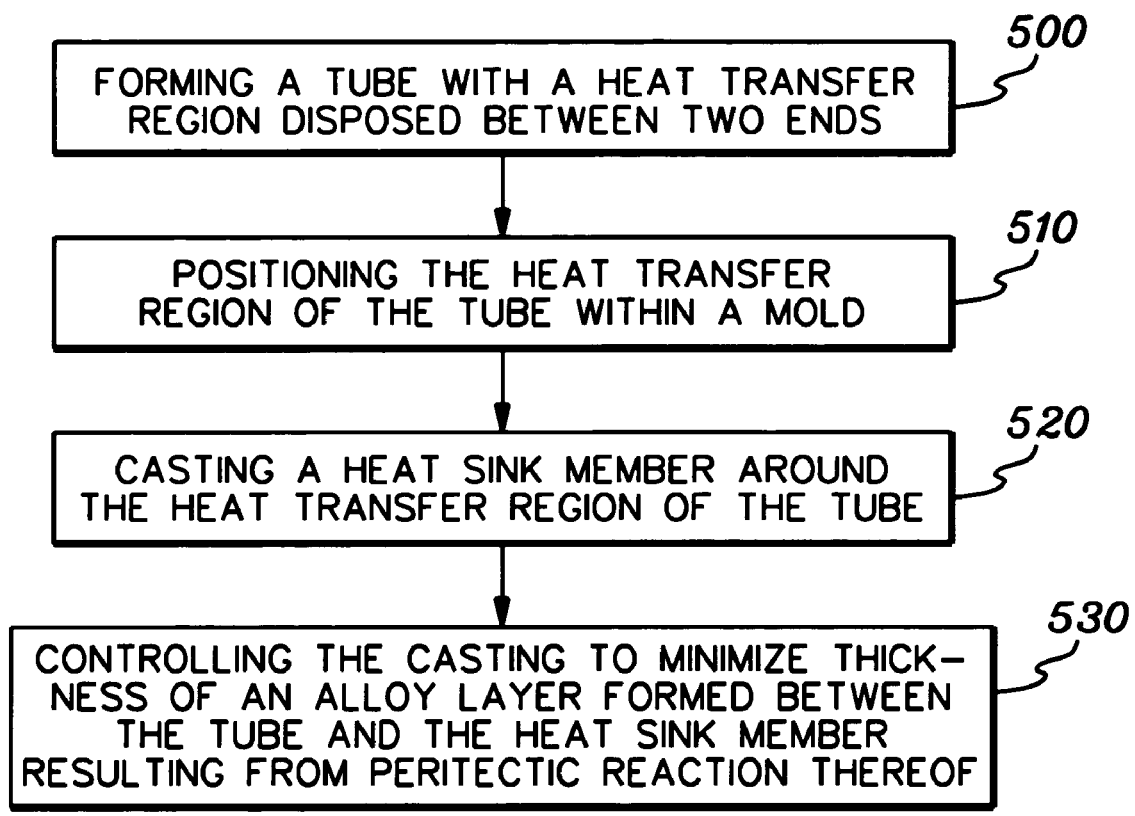
FIG. 5 is a flowchart of one embodiment of a method of fabricating a cold plate apparatus, in accordance with an aspect of the present invention.

Referring to FIG. 5, presented herein are techniques for fabricating a cold plate apparatus for a heat generating electronics component. The fabricating techniques include: forming a tube comprising a first metal, and having a first end and a second end with a heat transfer region disposed therebetween 500; and positioning the heat transfer region of the tube within a mold, which has been configured to produce a cold plate apparatus designed to couple to at least one surface of the particular heat generating electronics component to be cooled 510. Employing the mold, the heat sink member is casted around the heat transfer region of the tube by contacting a second metal in molten form over the heat transfer region of the tube 520. The second metal has a lower melting point then the first metal, and the first metal of the tube and the molten second metal react peritectically during casting of the heat sink member to form an alloy layer between the tube and the heat sink member in the heat transfer region of the tube. A metallurgical bond is also formed between the tube and the heat sink member in the heat transfer region of the tube with cooling of the molten second metal. The first end and the second end of the tube extend from the heat sink member. The fabrication technique further includes controlling the casting of the heat sink member to minimize a thickness of the alloy layer formed between the tube and the heat sink member in the heat transfer region of the tube, wherein minimizing the thickness of the alloy layer enhances a heat transfer characteristic of the metallurgical bond formed between the tube, the alloy layer and the heat sink member 530.

In more specific aspects, the second metal comprises aluminum, and controlling the casting includes pouring the molten aluminum into the mold at a temperature below 750° C. and cooling the aluminum at a fast rate of cooling. Forming the tube can include forming the tube with a sinusoidal-shaped or other curved, complex shape in the heat transfer region thereof. Still further, the fabrication approach can include casting the heat sink member with at least one surface thereof configured to mate to at least one surface of the heat generating electronics component, and polishing the at least one surface of the heat sink member to facilitate coupling thereof to the at least one surface of the heat generating electronic component.

Advantageously, a cold plate apparatus can be fabricated in accordance with the present invention by casting molten aluminum around a tube comprising a metal which reacts peritectically with the molten aluminum. By way of example, a copper tube coated with a metal layer comprising at least one of niobium, chromium, hafnium, tantalum, zirconium, titanium and tungsten is protected from dissolving in the molten aluminum by the peritectic reaction of the protective metal coating.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of fabricating a cold plate apparatus for facilitating cooling of a heat generating electronics component, the method comprising:

forming a tube comprising a first metal, the tube having a first end and a second end with a heat transfer region disposed therebetween;

positioning the heat transfer region of the tube within a mold and casting a heat sink member around the heat transfer region of the tube by contacting a second metal in molten form over the heat transfer region of the tube, wherein the second metal has a lower melting point than the first metal, the first metal of the tube and the molten second metal react peritectically during casting of the heat sink member to form an alloy layer between the tube and the heat sink member in the heat transfer region of the tube, and a metallurgical bond is formed between the tube and the heat sink member in the heat transfer region of the tube with cooling of the molten second metal, and wherein the first end and the second end of the tube extend from the heat sink member; and controlling the casting of the heat sink member to minimize a thickness of the alloy layer formed between the tube and the heat sink member in the heat transfer region of the tube, wherein minimizing the thickness of the alloy layer enhances a heat transfer characteristic of the metallurgical bond formed between the tube and the heat sink member.

2. The method of claim 1, wherein forming the tube comprises forming a tube structure with a coating over an outer surface thereof, the coating comprising the first metal, and wherein the tube structure comprises a third metal, which if exposed to the molten second metal, would react peritectically therewith, the first metal of the coating isolating the third metal from the molten second metal in the heat transfer region of the tube during the casting of the heat sink member.

3. The method of claim 2, wherein the first metal comprises one of niobium, chromium, hafnium, tantalum, zirconium, titanium and tungsten, the second metal comprises aluminum, and the third metal comprises one of copper, cobalt, iron, lithium, magnesium and nickel.

4. The method of claim 2, wherein forming the tube further comprises coating the outer surface of the tube structure with the first metal to a thickness in the range of 0.02-0.2 mm, the coating comprising employing at least one of sputtering, physical vapor deposition, ion vapor deposition, electroplating or electroless plating the first metal over the outer surface of the tube structure.

5. The method of claim 1, wherein the first metal comprises one of niobium, chromium, hafnium, tantalum, zirconium, titanium and tungsten, and the second metal comprises aluminum.

6. The method of claim 1, wherein the second metal comprises aluminum, and the controlling the casting further comprises pouring molten aluminum into the mold at a temperature below 750°.

7. The method of claim 1, wherein forming the tube further comprises forming the tube with a sinusoidal shape in the heat transfer region thereof.

8. The method of claim 1, further comprising casting the heat sink member with at least one surface thereof configured to mate to at least one surface of the heat generating electronics component, and polishing the at least one surface of the heat sink member to facilitate coupling thereof to the at least one surface of the heat generating electronics component.

* * * * *